(12) United States Patent
Yamada et al.

(10) Patent No.: US 12,418,284 B2
(45) Date of Patent: Sep. 16, 2025

(54) SEMICONDUCTOR DEVICE, ELECTRONIC APPLIANCE, AND VEHICLE

(71) Applicant: ROHM CO., LTD., Kyoto (JP)

(72) Inventors: Katsuaki Yamada, Kyoto (JP); Makoto Sada, Kyoto (JP); Toru Takuma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 85 days.

(21) Appl. No.: 18/465,338

(22) Filed: Sep. 12, 2023

(65) Prior Publication Data

US 2024/0088884 A1 Mar. 14, 2024

(30) Foreign Application Priority Data

Sep. 14, 2022 (JP) ................. 2022-145994

(51) Int. Cl.
*H03K 17/081* (2006.01)
*B60L 50/50* (2019.01)
*H03K 17/06* (2006.01)
*H03K 17/687* (2006.01)

(52) U.S. Cl.
CPC ........ *H03K 17/08104* (2013.01); *B60L 50/50* (2019.02); *H03K 17/063* (2013.01); *H03K 17/6871* (2013.01)

(58) Field of Classification Search
CPC ........... H03K 17/08104; H03K 17/063; H03K 17/6871; H03K 17/0822; H03K 17/04206; H03K 17/687; H03K 17/0812; H03K 17/0814; B60L 50/50
See application file for complete search history.

(56) References Cited

U.S. PATENT DOCUMENTS

| | | |
|---|---|---|
| 2019/0123541 A1 | 4/2019 | Takuma et al. |
| 2020/0403393 A1 | 12/2020 | Takuma et al. |
| 2022/0037872 A1 | 2/2022 | Takuma et al. |
| 2023/0216289 A1 | 7/2023 | Takuma et al. |

FOREIGN PATENT DOCUMENTS

| | | | | |
|---|---|---|---|---|
| WO | WO 2017/187785 | | 11/2017 | |
| WO | WO-2022163113 A1 | * | 8/2022 | ......... H01L 27/0629 |

* cited by examiner

*Primary Examiner* — Metasebia T Retebo
(74) *Attorney, Agent, or Firm* — Fish & Richardson P.C.

(57) ABSTRACT

A semiconductor device includes: a first output transistor and a second output transistor configured to be connected between a first terminal and second terminal; an active clamp circuit configured to be connected to a first control terminal of the first output transistor to limit a terminal-to-terminal voltage appearing between the first and second terminals to a clamp voltage or less; a first variable resistive element provided between a node configured to be fed with a control signal and the first control terminal; a second variable resistive element provided between the node and a second control terminal of the second output transistor; and a turn-off circuit configured to be connected to a connection node between the second variable resistive element and the second control terminal so as to be able to turn the second output transistor off.

10 Claims, 6 Drawing Sheets

SEMICONDUCTOR DEVICE, ELECTRONIC APPLIANCE, AND VEHICLE

CROSS-REFERENCE TO RELATED APPLICATIONS

This nonprovisional application claims priority under 35 U.S.C. § 119(a) on Patent Application No. 2022-145994 filed in Japan on Sep. 14, 2022, the entire contents of which are hereby incorporated by reference.

BACKGROUND OF THE INVENTION

1. Technical Field

The invention disclosed herein relates to semiconductor devices, electronic appliances, and vehicles.

2. Description of Related Art

The present applicant has been developing many new technologies related to semiconductor devices such as vehicle onboard IPDs (intelligent power devices) (see, for example, WO 2017/187785).

DETAILED DESCRIPTION OF PREFERRED EMBODIMENTS

In the present description, a MOS (metal-oxide-semiconductor) field-effect transistor denotes a transistor of which the gate has a structure composed of at least three layers which are: a layer of a conductor or a semiconductor with a low resistance value such as polysilicon; a layer of an insulator; and a layer of a P-type, N-type, or intrinsic semiconductor. That is, a MOS field-effect transistor may have any gate structure other than a three-layer structure of metal, oxide, and semiconductor.

<Electronic Appliance>

Figure 1:
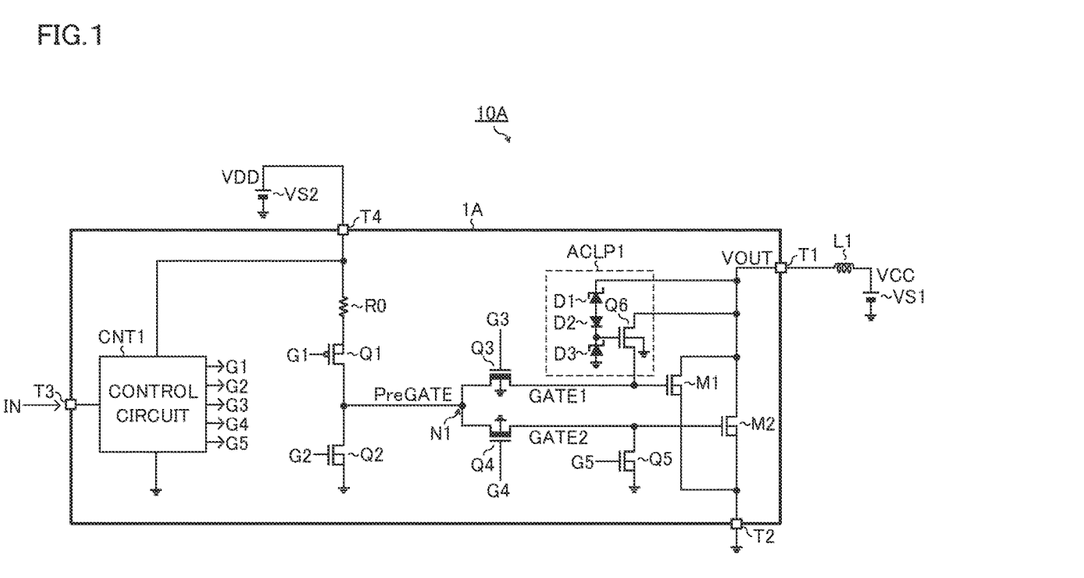
FIG. 1 is a diagram showing one configuration example of an electronic appliance including a semiconductor device.

FIG. 1 is a diagram showing one configuration example of an electronic appliance including a semiconductor device. The electronic appliance 10A of this configuration example includes a semiconductor device 1A, an inductor L1 as an inductive load, and direct-current power supplies VS1 and VS2.

The semiconductor device 1A is a low-side switch IC (a kind of IPD) that switches between a conducting state and a cut-off state the path between the inductor L1 and a ground potential.

The semiconductor device 1A has terminals T1 to T4 as means for establishing electrical contact with outside the device. The terminal T1 is connected to a first terminal of the inductor L1. The second terminal of the inductor L1 is connected to the positive pole of the power supply VS1. The terminal T2 is connected to the ground potential. The terminal T3 receives an input signal IN. The terminal T4 is connected to the positive pole of the power supply VS2. The negative poles of the direct-current power supplies VS1 and VS2 are connected to the ground potential. The power supply VS1 outputs a voltage VCC. The power supply VS2 outputs a voltage VDD. The voltages VCC and VDD can be voltages with the same value, or can be voltages with mutually different values.

The semiconductor device 1A includes a control circuit CNT1, a resistor R0, a MOS field-effect transistors Q1 to Q5, an active clamp circuit ACLP1, and output transistors M1 and M2.

The control circuit CNT1 is connected to the terminal T4. The control circuit CNT1 is connected also to the ground potential. The control circuit CNT1 is connected to the terminal T3 and performs control operation based on the input signal IN.

The first terminal of the resistor R0 is connected to the terminal T4. The second terminal of the resistor R0 is connected to the source and the back gate of the MOS field-effect transistor Q1.

The MOS field-effect transistor Q1 is a P-channel enhancement MOS field-effect transistor. Incidentally, the control circuit CNT1 includes another MOS field-effect transistor that pairs with the MOS field-effect transistor Q1 to constitute a current mirror.

The drain of the MOS field-effect transistor Q1 is connected to the drain of the MOS field-effect transistor Q2 and to a node N1. The source and the back gate of the MOS field-effect transistor Q2 are connected to the ground potential.

The MOS field-effect transistor Q2 is an N-channel enhancement MOS field-effect transistor. Incidentally, the control circuit CNT1 includes another MOS field-effect transistor that pairs with the MOS field-effect transistor Q2 to constitute a current mirror.

If the input signal IN is at high level, the control circuit CNT1 keeps a gate signal G1 fed to the gate of the MOS field-effect transistor Q1 at low level and keeps a gate signal G2 fed to the gate of the MOS field-effect transistor Q2 at low level. When the control circuit CNT1 keeps the gate signal G1 fed to the gate of the MOS field-effect transistor Q1 at low level and keeps the gate signal G2 fed to the gate of the MOS field-effect transistor Q2 at low level, the MOS field-effect transistor Q1 is on and the MOS field-effect transistor Q2 is off. When the MOS field-effect transistor Q1 is on and the MOS field-effect transistor Q2 is off, a control signal PreGATE fed to the node N1 is at high level (≈voltage VDD).

By contrast, if the input signal IN is at low level, the control circuit CNT1 keeps the gate signal G1 fed to the gate of the MOS field-effect transistor Q1 at high level and keeps the gate signal G2 fed to the gate of the MOS field-effect transistor Q2 at high level. When the control circuit CNT1 keeps the gate signal G1 fed to the gate of the MOS field-effect transistor Q1 at high level and keeps the gate signal G2 fed to the gate of the MOS field-effect transistor Q2 at high level, the MOS field-effect transistor Q1 is off and the MOS field-effect transistor Q2 is on. When the MOS field-effect transistor Q1 is off and the MOS field-effect transistor Q2 is on, the control signal PreGATE fed to the node N1 is at low level (≈ground potential).

The node N1 is connected to the sources of the MOS field-effect transistors Q3 and Q4. The MOS field-effect transistors Q3 and Q4 are N-channel depression MOS field-effect transistors. The back gates of the MOS field-effect transistors Q3 and Q4 are connected to the ground potential. The drain of the MOS field-effect transistor Q3 is connected to the gate of the output transistor M1. The drain of the MOS field-effect transistor Q4 is connected to the gate of the output transistor M2.

Figure 2:
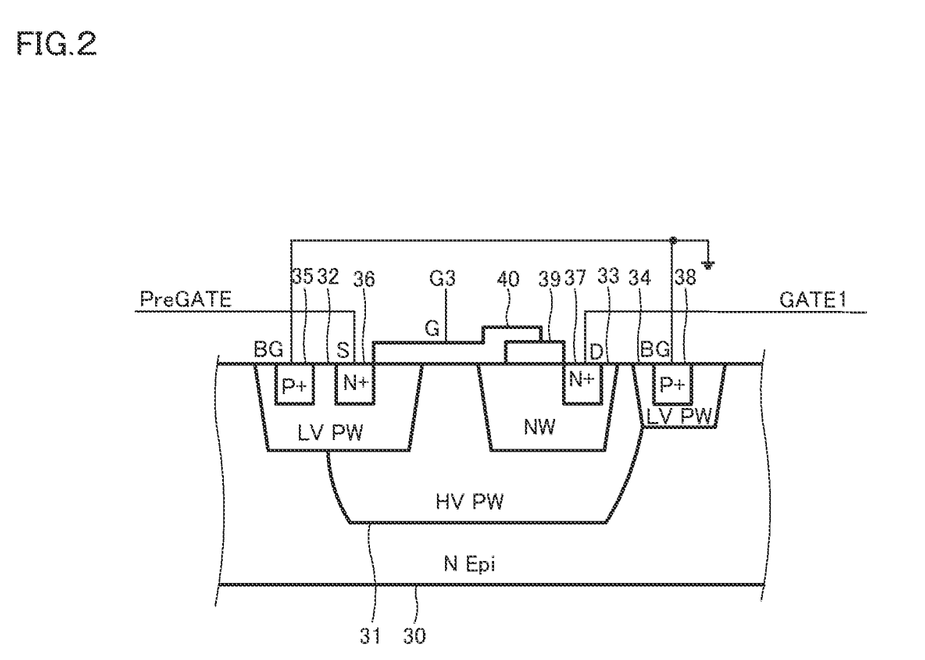
FIG. 2 is a schematic diagram showing the sectional structure of an N-channel depression MOS field-effect transistor.

The MOS field-effect transistor Q3 is one example of a first variable resistive element provided between the node N1 and the gate of the output transistor M1. The first variable resistive element can be a non-linear element such as an enhancement MOS field-effect transistor or any type of transistor other than a MOS field-effect transistor, or can be a linear element. Implementing the first variable resistive element as a non-linear element makes it easy to widen the range of the resistance value of the first variable resistive element. Implementing the first variable resistive element as a depression MOS field-effect transistor permits its back gate to be connected to the ground potential; this prevents formation of a current path through a parasitic element (see FIG. 2) and thus makes it easy to increase the resistance value of the first variable resistive element in both directions. FIG. 2 is a schematic diagram showing an example of the sectional structure of the MOS field-effect transistor Q3, which an N-channel depression MOS field-effect transistor. The MOS field-effect transistor Q3 has: an N-type epitaxial layer 30; a high-level P-type well 31, a low-level P-type well 32, an N-type well 33, and a low-level P-type well 34 formed in the N-type epitaxial layer 30; a high-concentration P-type dopant region 35 and a high-concentration N-type dopant region 36 formed in the low-level P-type well 32; a high-concentration N-type dopant region 37 formed in the N-type well 33; a high-concentration P-type dopant region 38 formed in the low-level P-type well 34; an insulation layer 39 formed on the N-type well 33; and a gate electrode 40 formed on across the low-level P-type well 32, the high-level P-type well 31, the N-type well 33, and the insulation layer 39.

The MOS field-effect transistor Q4 is one example of a second variable resistive element provided between the node N1 and the gate of the output transistor M2. The second variable resistive element can be a non-linear element such as an enhancement MOS field-effect transistor or any type of transistor other than a MOS field-effect transistor, or can be a linear element. Implementing the second variable resistive element as a non-linear element makes it easy to widen the range of the resistance value of the second variable resistive element. Implementing the second variable resistive element as a depression MOS field-effect transistor permits its back gate to be connected to the ground potential; this prevents formation of a current path through a parasitic element and thus makes it easy to increase the resistance value of the second variable resistive element in both directions.

The MOS field-effect transistors Q3 and Q4 are each a high-withstand-voltage elements. That is, the MOS field-effect transistors Q3 and Q4 have higher withstand voltages than those of the MOS field-effect transistors Q1 and Q2.

The output transistors M1 and M2 are each an N-channel power MISFET (metal-insulator-semiconductor field-effect transistor). The drains of the output transistors M1 and M2 are connected to the terminal T1. The sources and the back gates of the output transistors M1 and M2 are connected to the terminal T2.

The drain of the MOS field-effect transistor Q5 is connected to the gate of the output transistor M2 and to the drain of the MOS field-effect transistor Q4. The MOS field-effect transistor Q5 is an N-channel enhancement MOS field-effect transistor. The source and the back gate of the MOS field-effect transistor Q5 are connected to the ground potential.

The MOS field-effect transistor Q5 is one example of a turn-off circuit that can turn the output transistor M2 off. When the active clamp circuit ACLP1 is in action, the control circuit CNT1 keeps a gate signal G5 fed to the gate of the MOS field-effect transistor Q5 at high level. That is, during the transition of the output transistors M1 and M2 from on to off, the control circuit CNT1 keeps the gate signal G5 fed to the gate of the MOS field-effect transistor Q5 at high level. Thus, when the active clamp circuit ACLP1 is in action, the MOS field-effect transistor Q5 keeps the output transistor M2 off. In this way, the output transistor M1 alone is left as an output transistor that absorbs the counter-electromotive energy. This helps alleviate the concentration of heat in the output transistors during active clamping and hence increase the active clamp tolerance.

The active clamp circuit ACLP1 limits the terminal-to-terminal voltage appearing between the terminals T1 and T2 to a clamp voltage or less. The active clamp circuit ACLP1 includes a MOS field-effect transistor Q6, a Zener diode D1, a diode D2, and a Zener diode D3. The MOS field-effect transistor Q6 is an N-channel enhancement MOS field-effect transistor.

The cathode of the Zener diode D1 and the drain of the MOS field-effect transistor Q6 are connected to the terminal T1 and to the drains of the output transistors M1 and M2. The anode of the Zener diode D1 is connected to the anode of the diode D2. The cathode of the diode D2 and the cathode of the Zener diode D3 are connected to the gate of the MOS field-effect transistor Q6. The anode of the Zener diode D3 and the back gate of the MOS field-effect transistor Q6 are connected to the ground potential. The source of the MOS field-effect transistor Q6 is connected to the gate of the output transistor M1 and to the drain of the MOS field-effect transistor Q3. Instead of the Zener diode D1, a series circuit of a plurality of Zener diodes may be used.

When the input signal IN turns from low level to high level, until a predetermined period elapses after that, the control circuit CNT1 keeps the MOS field-effect transistors Q3 and Q4 on. As a result, when the gates of the output transistors M1 and M2 are charged, the MOS field-effect transistors Q3 and Q4 have a low resistance of about 30 S2, and thus the output transistors M1 and M2 turn on fast.

When the input signal IN turns from high level to low level, until a predetermined period elapses after that, the control circuit CNT1 keeps the MOS field-effect transistors Q3 and Q4 on. As a result, when the gates of the output transistors M1 and M2 are discharged, the MOS field-effect transistors Q3 and Q4 have a low resistance of about 30 S2, and thus the output transistors M1 and M2 turn off fast.

When the active clamp circuit ACLP1 is in action and in addition the MOS field-effect transistor Q5 is off, the control circuit CNT1 keeps the MOS field-effect transistors Q3 and Q4 off. As a result, when the active clamp circuit ACLP1 is in action, the MOS field-effect transistors Q3 and Q4 have a high resistance of about 10 kΩ or more. Thus, even if the active clamp circuit ACLP1 is in action and in addition the MOS field-effect transistors Q5 and Q6 are on, gate signals GATE1 and GATE2 can be given mutually different levels.

With the configuration described above, the semiconductor device 1A achieves both enhanced active clamp tolerance and fast switching.

In a screening test conducted to check for defects in the gate insulation layer in the output transistors M1 and M2, the control circuit CNT1 keeps the MOS field-effect transistors Q3 and Q4 off. As a result, in a screening test, the MOS field-effect transistors Q3 and Q4 have a high resistance of about 10 kΩ or more. Thus, in a screening test, the MOS field-effect transistors Q3 and Q4 can be given mutually different source potentials and mutually different drain potentials. In this way, even when a high voltage is applied to the output transistors M1 and M2, the MOS field-effect transistors Q1 and Q2 can be prevented from being exposed to a high voltage.

Figure 3:
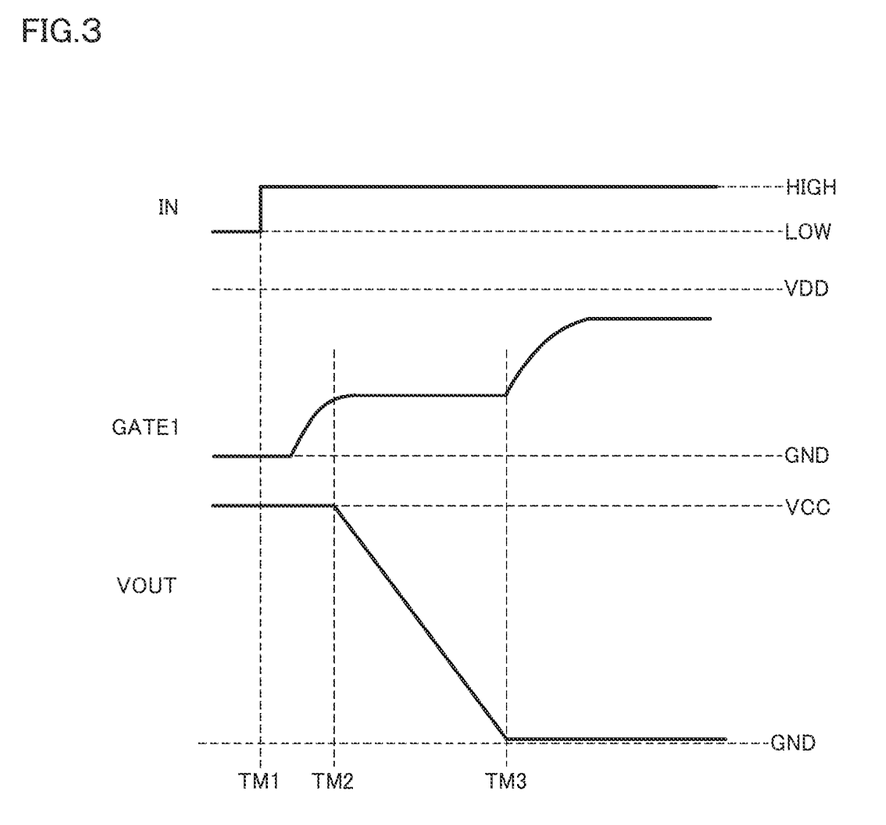
FIG. 3 is a timing chart showing an example of the waveforms of an input signal, a gate signal, and an output voltage.

FIG. 3 is a timing chart showing an example of the waveforms of the input signal IN, the gate signal GATE1, and the output voltage VOUT appearing at the terminal T1 in the semiconductor device 1A. The timing chart in FIG. 3 shows what takes place when the input signal IN turns from low level to high level.

When, at time point TM1, the input signal IN turns from low level to high level, the MOS field-effect transistor Q3 turns on, resulting in the MOS field-effect transistor Q3 having a low resistance. After, at time point TM1, the input signal IN turns from low level to high level, the gate of the output transistor M1 starts to be charged. As the gate potential of the output transistor M1 rises, at time point TM2 the output transistor M1 starts being half on, and the output voltage VOUT starts to fall. When, at time point TM3, the output voltage VOUT falls to close to the ground potential, the MOS field-effect transistor Q3 turns off, resulting in the MOS field-effect transistor Q3 having a high resistance. Now, the gate signal GATE1 stabilizes at a value lower than the voltage VDD by the sum of the threshold voltage Vth of the MOS field-effect transistor Q3 and a gain coefficient β.

Figure 4:
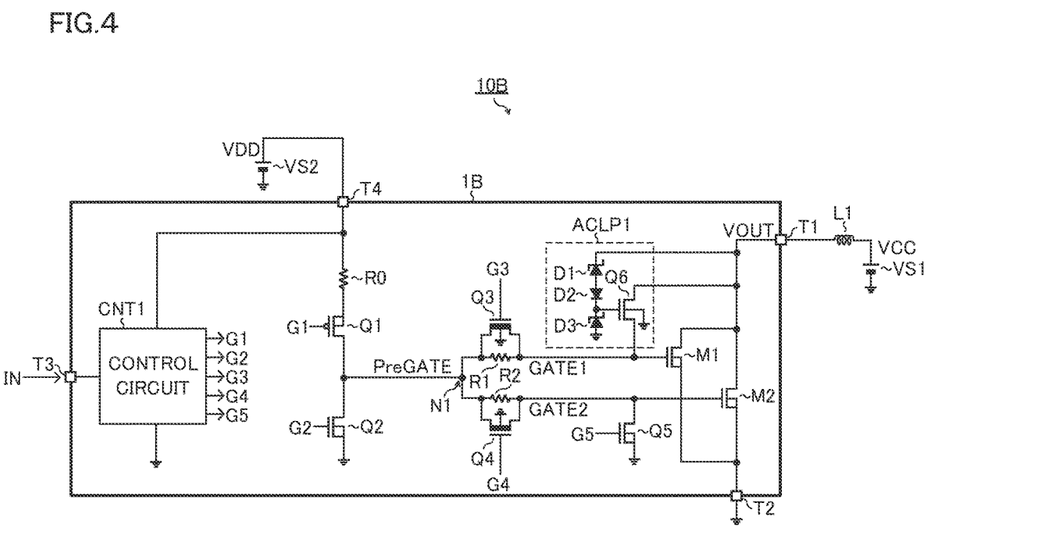
FIG. 4 is a diagram showing another configuration example of an electronic appliance including a semiconductor device.

FIG. 4 is a diagram showing another configuration example of an electronic appliance including a semiconductor device. The electronic appliance 10B of this configurations includes a semiconductor device 1B, an inductor L1 as an inductive load, and direct-current power supplies VS1 and VS2. The semiconductor device 1B, compared with the semiconductor device 1A described previously, additionally includes resistors R1 and R2.

The resistor R1 is connected in parallel with the MOS field-effect transistor Q3. The resistor R2 is connected in parallel with the MOS field-effect transistor Q4. The resistors R1 and R2 are each a fixed resistor with a high resistance, specifically with a resistance value of 10 kΩ or more.

Providing the resistors R1 and R2 results in higher levels of the gate signals GATE1 and GATE2 with the output transistors M1 and M2 on, and this helps reduce the on-resistances of the output transistors M1 and M2.

Figure 5:
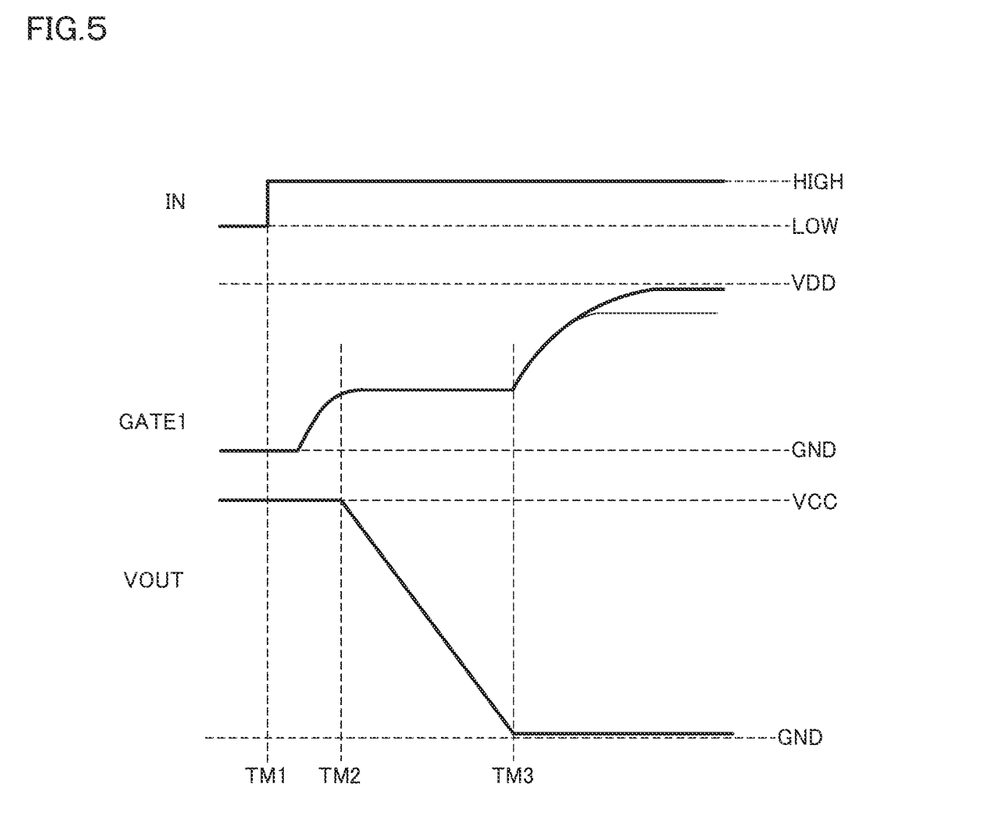
FIG. 5 is a timing chart showing an example of the waveforms of an input signal, a gate signal, and an output voltage.

FIG. 5 is a timing chart showing an example of the waveforms of the input signal IN, the gate signal GATE1, and the output voltage VOUT appearing at the terminal T1 in the semiconductor device 1B. The timing chart in FIG. 5 shows what takes place when the input signal IN turns from low level to high level. Note that the thin solid line in FIG. 5 represents the waveform of the gate signal GATE1 in the semiconductor device 1A.

When, at time point TM1, the input signal IN turns from low level to high level, the MOS field-effect transistor Q3 turns on, resulting in the MOS field-effect transistor Q3 having a low resistance. After, at time point TM1, the input signal IN turns from low level to high level, the gate of the output transistor M1 starts to be charged. As the gate potential of the output transistor M1 rises, at time point TM2 the output transistor M1 starts being half on, and the output voltage VOUT starts to fall. When, at time point TM3, the output voltage VOUT falls to close to the ground potential, the MOS field-effect transistor Q3 turns off, resulting in the MOS field-effect transistor Q3 having a high resistance. Here, owing to the resistor R1, the gate signal GATE1 rises to close to the voltage VDD.

<Application to Vehicles>

Figure 6:
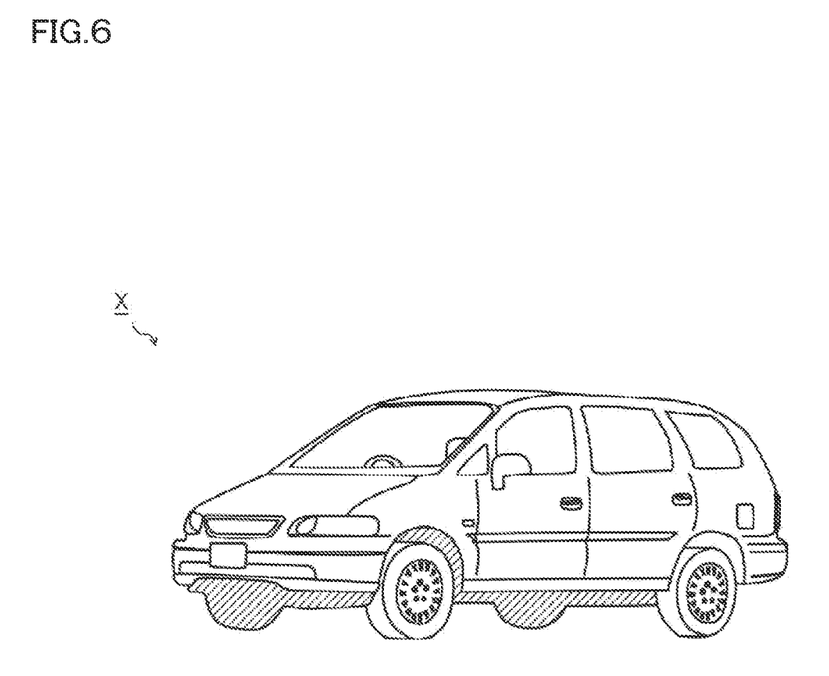
FIG. 6 is an exterior view showing one configuration example of a vehicle.

FIG. 6 is an exterior view showing one configuration example of a vehicle. The vehicle X of this configuration example incorporates various electronic appliances that operate by being supplied with electric power from a battery.

The vehicle X can be an engine vehicle, or an electric vehicle (such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

The vehicle X can incorporate, for example, the electronic appliance 10A or 10B described previously.

<Modifications>

Embodiments of the present disclosure allow for any modifications as necessary within the scope of the technical ideas recited in the appended claims. Unless inconsistent, the different embodiments described above can be implemented in any combination. The embodiments described above are merely examples of implementing the present disclosure, and what is meant by any of the terms used to describe what is disclosed herein and the components of it is not limited to that mentioned in connection with the embodiments.

For example, while the above embodiment deals with an example of application to a low-side switch IC, a circuit configuration similar to that of the above embodiment can be applied to a high-side switch IC.

<Notes>

To follow are additional notes on the present disclosure of which a specific configuration example has been described by way of embodiment above.

According to one aspect of what is disclosed herein, a semiconductor device (1A, 1B) includes: a first output transistor (M1) and a second output transistor (M2) configured to be connected between a first terminal (T1) and second terminal (T2); an active clamp circuit (ACLP1) configured to be connected to a first control terminal of the first output transistor to limit a terminal-to-terminal voltage appearing between the first and second terminals to a clamp voltage or less; a first variable resistive element (Q3) provided between a node (N1) configured to be fed with a control signal and the first control terminal; a second variable resistive element (Q4) provided between the node and a second control terminal of the second output transistor; and a turn-off circuit (Q5) configured to be connected to a connection node between the second variable resistive element and the second control terminal so as to be able to turn the second output transistor off. (A first configuration.)

In the semiconductor device of the first configuration described above, when the active clamp circuit is in action, the turn-off circuit may keep the second output transistor off. (A second configuration.)

In the semiconductor device of the first or second configuration described above, the first and second variable resistive elements are each a non-linear element. (A third configuration.)

In the semiconductor device of the third configuration described above, the non-linear element may be a transistor. (A fourth configuration.)

In the semiconductor device of the fourth configuration described above, the transistor may be a MOS field-effect transistor. (A fifth configuration.)

In the semiconductor device of the fifth configuration described above, the MOS field-effect transistor may be a depression MOS field-effect transistor. (A sixth configuration.)

In the semiconductor device of any of the third to sixth configurations described above, when the first and second control terminals are charged, the non-linear element may be on. (A seventh configuration.)

In the semiconductor device of any of the third to seventh configurations described above, when the active clamp circuit is in action, the non-linear element may be off. (An eighth configuration.)

The semiconductor device of any of the first to eighth configurations described above may further include: a first resistor connected in parallel with the first variable resistive element; and a second resistor connected in parallel with the second variable resistive element. (A ninth configuration.)

According to another aspect of what is disclosed herein, an electronic appliance (10A, 10B) includes: the semiconductor device of any of the first to ninth configurations described above; and an inductive load (L1) connected to the semiconductor device. (A tenth configuration.)

According to yet another aspect of what is disclosed herein, a vehicle (X) includes the electronic appliance of the tenth configuration described above. (An eleventh configuration.)

What is claimed is:

1. A semiconductor device, comprising:
   a first output transistor and a second output transistor configured to be connected between a first terminal and second terminal;
   an active clamp circuit configured to be connected to a first control terminal of the first output transistor to limit a terminal-to-terminal voltage appearing between the first and second terminals to a clamp voltage or less;
   a first variable resistive element provided between a node configured to be fed with a control signal and the first control terminal;
   a second variable resistive element provided between the node and a second control terminal of the second output transistor;
   a turn-off circuit configured to be connected to a connection node between the second variable resistive element and the second control terminal so as to be able to turn the second output transistor off;
   a first resistor connected in parallel with the first variable resistive element; and
   a second resistor connected in parallel with the second variable resistive element.

2. The semiconductor device according to claim 1, wherein
   when the active clamp circuit is in action, the turn-off circuit keeps the second output transistor off.

3. The semiconductor device according to claim 1, wherein
   the first and second variable resistive elements are each a non-linear element.

4. The semiconductor device according to claim 3, wherein
   the non-linear element is a transistor.

5. The semiconductor device according to claim 4, wherein
   the transistor is a MOS field-effect transistor.

6. The semiconductor device according to claim 5, wherein
   the MOS field-effect transistor is a depression MOS field-effect transistor.

7. The semiconductor device according to claim 3, wherein
   when the first and second control terminals are charged, the non-linear element is on.

8. The semiconductor device according to claim 3, wherein
   when the active clamp circuit is in action, the non-linear element is off.

9. An electronic appliance, comprising:
   the semiconductor device according to claim 1; and
   an inductive load connected to the semiconductor device.

10. A vehicle, comprising the electronic appliance according to claim 9.

* * * * *